United States Patent
Perlmutter et al.

(10) Patent No.: US 10,615,953 B2
(45) Date of Patent: Apr. 7, 2020

(54) APPARATUSES AND METHODS FOR COMPENSATING PHASE FLUCTUATIONS

(71) Applicant: Intel IP Corporation, Santa Clara, CA (US)

(72) Inventors: Uri Perlmutter, Holon (IL); Michael Kerner, Tel Mond (IL); Uri Parker, Shimshit (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/076,710

(22) PCT Filed: Jan. 26, 2017

(86) PCT No.: PCT/IB2017/050409
§ 371 (c)(1),
(2) Date: Aug. 9, 2018

(87) PCT Pub. No.: WO2017/153853
PCT Pub. Date: Sep. 14, 2017

(65) Prior Publication Data
US 2019/0052452 A1    Feb. 14, 2019

(30) Foreign Application Priority Data
Mar. 11, 2016    (EP) .................................... 16159874

(51) Int. Cl.
*H04L 7/00* (2006.01)
*H03L 7/08* (2006.01)
*H03L 7/081* (2006.01)
*H03L 7/093* (2006.01)
*H04L 7/033* (2006.01)
*H04B 1/12* (2006.01)

(52) U.S. Cl.
CPC .......... *H04L 7/0016* (2013.01); *H03L 7/0805* (2013.01); *H03L 7/0814* (2013.01); *H03L 7/093* (2013.01); *H04L 7/0331* (2013.01); *H03L 2207/50* (2013.01); *H04B 1/123* (2013.01)

(58) Field of Classification Search
USPC .......................... 375/340, 371; 327/159, 148
See application file for complete search history.

(56) References Cited

U.S. PATENT DOCUMENTS

| | | | |
|---|---|---|---|
| 7,986,190 B1 | 7/2011 | Lye | |
| 9,041,444 B1 | 5/2015 | Tarighat Mehrabani et al. | |
| 2002/0176483 A1 | 11/2002 | Craword | |
| 2005/0002475 A1* | 1/2005 | Menolfi | H04L 7/0334 375/340 |
| 2006/0171361 A1 | 8/2006 | Meilhac et al. | |
| 2007/0160168 A1 | 7/2007 | Beukema et al. | |
| 2008/0180142 A1* | 7/2008 | Chou | H03L 7/081 327/148 |

(Continued)

*Primary Examiner* — Eva Y Puente
(74) *Attorney, Agent, or Firm* — Kowert, Hood, Munyon, Rankin & Goetzel, P.C.

(57) ABSTRACT

The present disclosure relates to methods and apparatuses for compensating carrier or clock signal phase fluctuations. An apparatus comprises a digital phase locked loop (210) comprising a phase error output (214) for a phase error (216) between a reference signal (218) and an output signal (212) generated by the digital phase locked loop, and a phase rotator (220) coupled to the phase error output (214) and configured to rotate a phase of a data signal based on the phase error (216).

21 Claims, 6 Drawing Sheets

(56) References Cited

U.S. PATENT DOCUMENTS

| | | | |
|---|---|---|---|
| 2010/0074384 A1* | 3/2010 | Hirayama | H03L 7/093 375/371 |
| 2012/0063296 A1* | 3/2012 | Wang | H03L 7/18 370/216 |
| 2012/0224657 A1 | 9/2012 | Sasaki et al. | |
| 2013/0003568 A1 | 1/2013 | Xie et al. | |
| 2013/0209089 A1 | 8/2013 | Harley et al. | |
| 2015/0085960 A1 | 3/2015 | Kamiya et al. | |
| 2015/0311908 A1* | 10/2015 | Laaja | H03L 7/093 327/159 |
| 2015/0365095 A1 | 12/2015 | Hossain et al. | |
| 2018/0074120 A1* | 3/2018 | Gerowitz | G01R 31/317 |

* cited by examiner

APPARATUSES AND METHODS FOR COMPENSATING PHASE FLUCTUATIONS

FIELD

The present disclosure generally relates to communication systems and, more particularly, to apparatuses and methods for compensating phase fluctuations of carrier or clock signals.

BACKGROUND

Phase noise or phase jitter of carrier signals is a major limiting factor in many Radio Frequency (RF) communications systems as it can significantly affect the performance of systems. While in an ideal world it is possible to look at perfect carrier signals with no phase noise, this is not the case in real communication systems. Instead, all signals have some phase noise or phase jitter in them. For radio receivers, phase noise on local oscillators within the system can affect specifications such as reciprocal mixing and the noise floor. For transmitters it can affect the wideband noise levels that are transmitted. Additionally it can affect the bit error rate on systems using phase modulation as the phase jitter may just cause individual bits of data represented by the phase at the time to be misread.

System aspects require the use of low cost crystals with strict control. Traditional phase noise control is based on Analog Phase Lock Loops (APLLs). The emerging Digital Phase Lock Loop (DPLL) is a digital realization of the APLL, preserving functionality and performance. However phase lock loop is inherently suboptimal due to causality, delay in the loop and stability considerations. One benefit of DPLL is the availability of digital phase error metrics (EM).

Transmit phase noise is traditionally handled by PLL. Receivers provide additional phase noise cancelation schemes, commonly based on pilots or decoded data. These schemes combat thermal noise and multipath channel and heavily depend on signal framing and appropriate training.

Thus, there is a need for improved concepts of phase noise or phase error mitigation.

BRIEF DESCRIPTION OF THE DRAWINGS

Some examples of apparatuses and/or methods will be described in the following by way of example only, and with reference to the accompanying drawings, in which.

DESCRIPTION OF EMBODIMENTS

Figure 1:
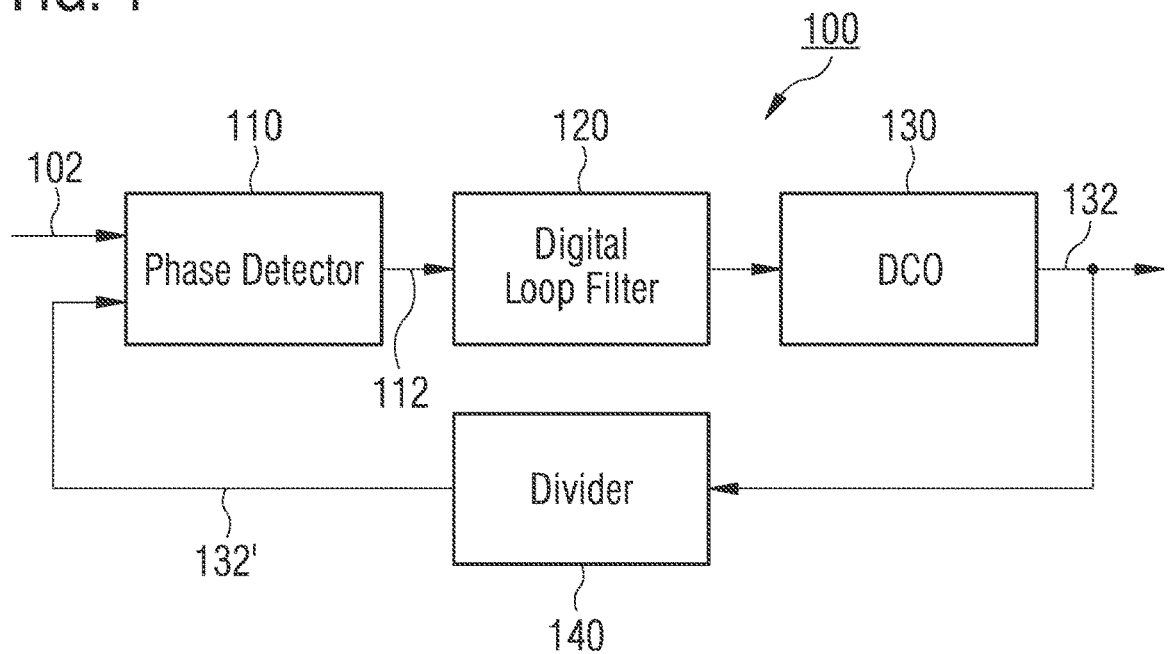
FIG. 1 shows a basic block diagram of an example DPLL.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

Portions of examples and corresponding detailed description may be presented in terms of software, or algorithms and symbolic representations of operation of data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative examples will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware at existing network elements or control nodes. Such existing hardware may include one or more Central Processing Units (CPUs), Digital Signal Processors (DSPs), Application-Specific Integrated Circuits, Field Programmable Gate Arrays (FPGAs), computers, or the like.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Furthermore, examples may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks.

An All Digital Phase Locked Loop (ADPLL) is an alternative to a traditional Phase Locked Loop (PLL) for implementation in nanoscale digital Complementary Metal-Oxide-Semiconductor (CMOS), especially as part of a System-on-Chip (SoC). One of the key advantages of ADPLLs over their analog counterparts is that they remove the need for large capacitors within the loop filter by utilizing digital circuits to achieve the desired filtering function. The resulting area savings are important for achieving low-cost solutions. Moreover, the phase error signal in an ADPLL is a digital word that is produced by means of digital circuits such as accumulators, samplers and Time-to-Digital Converters (TDCs). As a consequence, a much more attractive, mostly digital, design flow can be achieved. Furthermore, the essentially digital architecture of an ADPLL can be augmented with reconfigurable gains and a filter, or with a software-assisted digital processor for calibration.

A common application of ADPLLs is frequency synthesis. In frequency synthesis ADPLLs can be used to generate a clock or carrier signal which is based on a reference clock signal already existing. In some implementations, the newly generated clock or carrier signal can be at a multiple of the reference clock signal's frequency.

FIG. 1 shows a basic block diagram of an example (A)DPLL 100.

DPLL 100 comprises a phase detector 110 for detecting differences in phase (phase error) between an input signal 102, which can act as reference signal, and a fed back and optionally frequency divided output signal 132, 132'. An example of a phase detector that can be used in ADPLLs is a digital Phase Frequency Detector (PFD) optionally in combination with a Time-to-Digital Converter (TDC). For example, PFDs can be implemented using a plurality of flip flops. Other examples of a digital phase detector or comparator can by implemented using an exclusive-OR (XOR) logic gate, a sample and hold circuit, a charge pump, or a logic circuit consisting of flip-flops.

Phase detector 110 can output a digital signal or word 112 associated with the detected phase difference between signals 102 and 132'. This digital phase error word 112, which can also be referred to as phase error metric sample, can be fed to a digital loop filter 120 which can translate between the digital phase error word 112 and a (frequency) control word for a Digitally Controlled Oscillator (DCO) or Numerically Controlled Oscillator (NCO) 130 coupled to the output of the loop filter 120. Note that DCO 130 can also be replaced by Voltage Controlled Oscillator (VCO) in DPLLs. A DCO would be used in ADPLLs. The digital loop filter 120 can be implemented as a causal low pass filter, for example. One function of the digital loop filter 120 can be to determine loop dynamics, determining how the loop 100 responds to disturbances, such as changes in frequency of the reference signal 102, changes of the (optional) feedback frequency divider 140, or at startup. A further common consideration is limiting the amount of reference frequency energy (ripple) appearing at the phase detector output that is then applied to the DCO control input. This frequency can modulate the DCO 130 and produce FM sidebands.

DCO 130 can be a digital signal generator which can create a synchronous (i.e. clocked), discrete-time, discrete-valued representation of a waveform 132, usually sinusoidal. In one example, DCO 130 can be implemented using one or more ring oscillators. In some examples, DCO 130 can be used in conjunction with a Digital-to-Analog Converter (DAC) at its output for providing analog signals. As mentioned above, DCO 130 can also be replaced by Voltage Controlled Oscillator (VCO) in DPLL designs.

Optional divider 140 in the feedback path can perform frequency division on the DPLL's output signal 132 to generate a signal 132' which has the frequency of the input or reference signal 102 but the phase of the output signal 132. Note that this component may not be present in DPLLs which are designed to have an input or reference frequency equal to the output frequency (e.g. carrier frequency).

The skilled person having benefit from the present disclosure will appreciate that FIG. 1 merely illustrates a basic concept of a DPLL. Various alterations and modifications are known in the art and also applicable to the teachings of the present disclosure. However, a common feature of all DPLLs is the availability of digital phase error metric samples 112. The present disclosure suggests to use these error metric samples to (de-)rotate the phase of data path samples that will be or have been combined with the generated carrier signal 132 and thus to compensate for residual phase noise of the carrier signal 132 generated with a DPLL. This additional logic can be referred to as Phase Noise Canceler (PNC) and can be placed at a transmitter and/or a receiver of a wireless communications device, such as a mobile phone, smart phone, tablet PC, laptop PC, and the like. Note that the proposed PNC concept can be useful for any circuits employing DPLLs/ADPLLs. Any DPLL based clock generator may provide jitter/noise estimation that can be used for phase error compensation.

Figure 2:
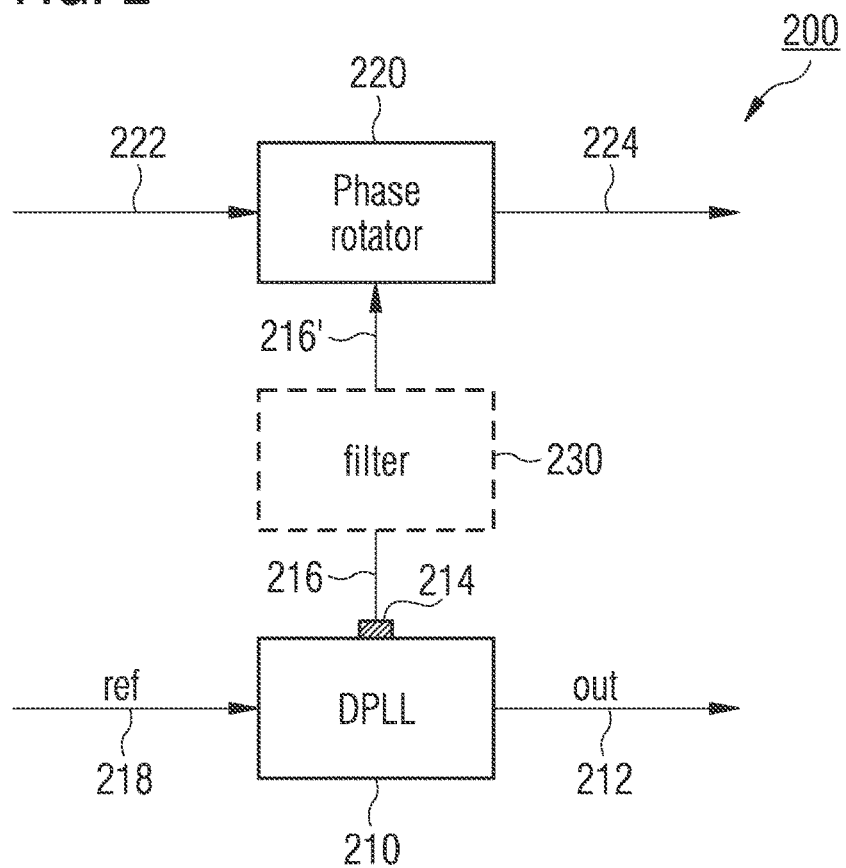
FIG. 2 illustrates a schematic block diagram of a phase noise cancelation apparatus.

A schematic block diagram of an example PNC apparatus 200 is illustrated in FIG. 2.

Apparatus 200 comprises a DPLL 210 for generating an output signal 212, which may be a carrier or any other clock signal, for example. In the following, output signal 212 will be regarded as a carrier signal for illustrative purposes. Carrier signal 212 may be regarded as a waveform (e.g., sinusoidal) that can be modulated (modified) with another signal for the purpose of conveying information. In some examples, carrier signal 212 can be a Radio Frequency (RF) carrier signal having a carrier frequency in the RF domain. DPLL 210, which may be similar to DPLL 100, comprises a phase error output 214 for a phase error signal 216 between a reference signal 218 and the carrier signal 212 generated by the DPLL 210. As mentioned above, phase error signal 216 can comprise phase error metric samples. In some example implementations, reference signal 218 can be indicative of a nominal target phase as defined by a nominal target carrier frequency. Thus, phase error signal 216 can be indicative of a phase difference between a nominal target carrier signal as reference signal 218 and the carrier signal 212 generated by the DPLL 210. Apparatus 200 further comprises a phase rotator 220 which is coupled to the phase error output 214 and configured to (de-)rotate a phase of a data signal 222 based on the phase error 216 to generate a compensated data signal 224. In other words, phase rotator 220 changes the phase of data signal 222 to possibly cancel the phase error of the carrier signal 212 with respect to the reference signal 218. Note that data signal 222 or compensated data signal 224 can comprise useful data. In other words, the amplitude and/or phase of data signal 222 or compensated data signal 224 can bear messages for information exchange between two or more participants.

Note that the compensated data signal 224 may be or already may have been combined with the carrier signal 212. Thus, in some examples, apparatus 200 can comprise one or more signal combiners configured to combine signal 222 with the carrier signal 212 prior to or after rotating the phase. For example, the combination of signals 222 and 212 may be for frequency up- or down-conversion. Thus, in some implementations, apparatus 200 may also comprise one or more frequency mixers configured to up- and/or down-convert the data signal 222 or the compensated data signal 224 using carrier signal 212. In the first case (frequency up-conversion), data signal 222 or compensated data signal 224 can be a transmit signal in a transmitter, while in the latter case (frequency down-conversion) data signal 222 or compensated data signal 224 can be a receive signal in a receiver. Thus, phase deviations of the (real) carrier signal 212 from an ideal or nominal carrier signal 218 may be reduced or even eliminated in data signal 222 or compensated data signal 224 combined with carrier signal 212.

As illustrated in FIG. 1, apparatus 200 can optionally also comprise filter circuitry 230 which can be coupled between the phase error output 214 and the phase rotator 220. The optional filter circuitry 230, which can be different or separate from the digital loop filter of the DPLL 230, can be configured to generate smoothened phase error values 216'. In other words, filter circuitry 230 may be used to separate an actual phase error in signal 216 from other error or noise effects in signal 216 caused by the DPLL 210, such as reference clock jitter or quantization noise, for example. Since the error or noise effects (e.g., phase jitter of reference clock, quantization noise, etc.) caused by DPLL 210 can have substantially higher bandwidth than the actual phase error between the reference signal 218 and the carrier signal 212, filter circuitry 230 can comprise a low pass filter with a cutoff frequency adjusted to the bandwidth of the actual phase error between the reference signal 218 and the carrier signal 212. Given a 76.8 MHz reference clock, the cutoff frequency may be in a range from 4 to 6 MHz, for example 5 MHz.

In some implementations, filter circuitry 230 can comprise a digital filter having filter coefficients which can be computed based on phase error samples and/or phase error statistics. For example, the filter can be based on the Minimum Mean Square Error (MMSE) criterion. Such a digital filter can minimize the Mean Square Error (MSE) between a desired and the noisy phase error signal 216. For practical implementations, a Linear MMSE (LMMSE) filter can be chosen. LMMSE filters, such as Wiener-Kolmogorov filters or Kalman filters, for example. The digital filter can be implemented as Finite Impulse Response (FIR) filter in some examples. The n-th filter output sample $out_n$ can be calculated according to $out_n = \sum_{k=0}^{pnc\_taps-1} in_{n-k} \cdot coef_k$, wherein $coef_k$ denotes the k-th of pnc_taps filter coefficients and wherein the n-th filter input sample is denoted as $in_n$. However, the skilled person having benefit from the present disclosure will appreciate that Infinite Impulse Response (IIR) filter designs are also feasible.

In some examples, filter circuitry 230 can comprise an adaptive digital filter. The adaptive filter can adapt to varying signal statistics of the phase error signal 216, for example, when a setup of the DPLL 210 is modified (e.g., different carrier frequency). Additionally or alternatively, the adaptive filter can comprise adaptive filter coefficients based on decision feedback, such as, for example, a Least Mean Squares (LMS) filter used to mimic a desired filter by finding the filter coefficients that relate to producing the least mean squares of a difference between the desired and the noisy signal phase error signal 216.

In some examples, filter circuitry 230 can comprise a non-causal filter whose output depends on past, present and future inputs. A non-causal filter can outperform causal filters with respect to error minimization. Further, a non-causal filter can have zero phase, i.e., a response in the frequency domain that has zero phase at all frequencies. However, a non-causal filter will cause a filter delay. In some implementations, this filter delay may correspond to inherent signal processing delays in the data path of data signal 222. Alternatively, data signal 222 may additionally be delayed accordingly to obtain time alignment with the filtered or smoothened phase error values 216'.

Figure 3:
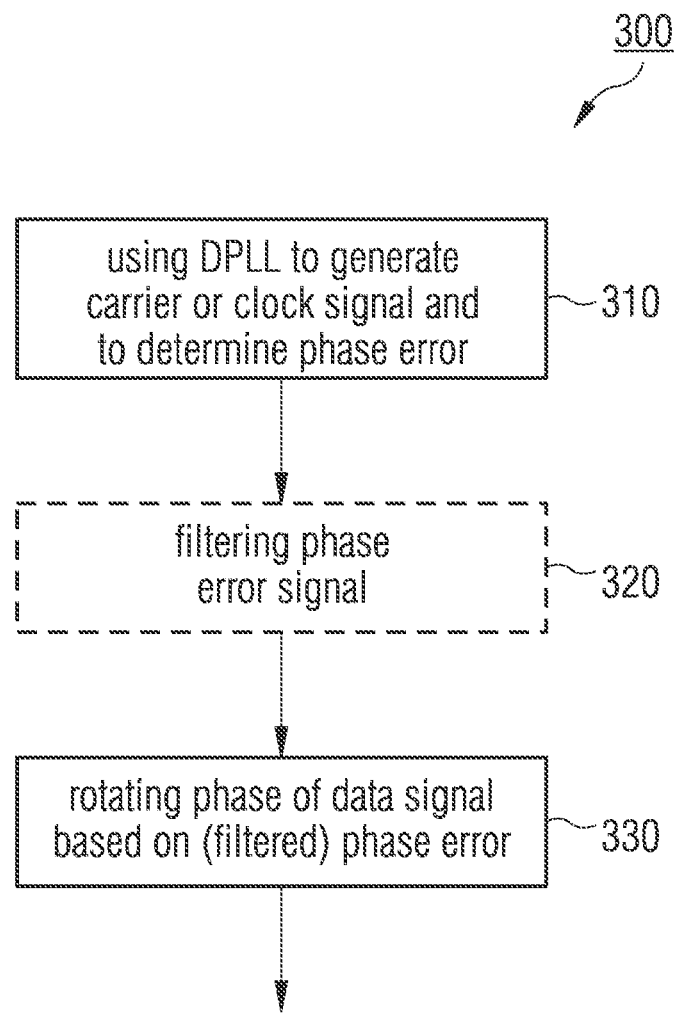
FIG. 3 shows a flow-chart of a phase noise cancelation method.

The skilled person having benefit from the present disclosure will appreciate that example implementation of apparatus 200 can be used to perform a corresponding method. A highlevel flowchart of such a method 300 for compensating carrier phase fluctuations is illustrated in FIG. 3.

Method 300 includes an act 310 of using a DPLL to generate a carrier signal and to determine a phase error between a reference signal and the carrier signal. Method 300 further includes rotating 330 a phase of a data signal based on the phase error before or after combining with the carrier signal. Between acts 310 and 330 method 300 can optionally further include filtering 320 phase error samples of the DPLL with a digital low pass filter, which may be non-causal. In this case the phase of the data signal may be rotated or changed based on the filtered phase error samples.

Some examples with regard to rotating the phase of quadrature modulated signals and polar modulated signals with now be described referring to FIG. 4 and FIG. 5.

Figure 4:
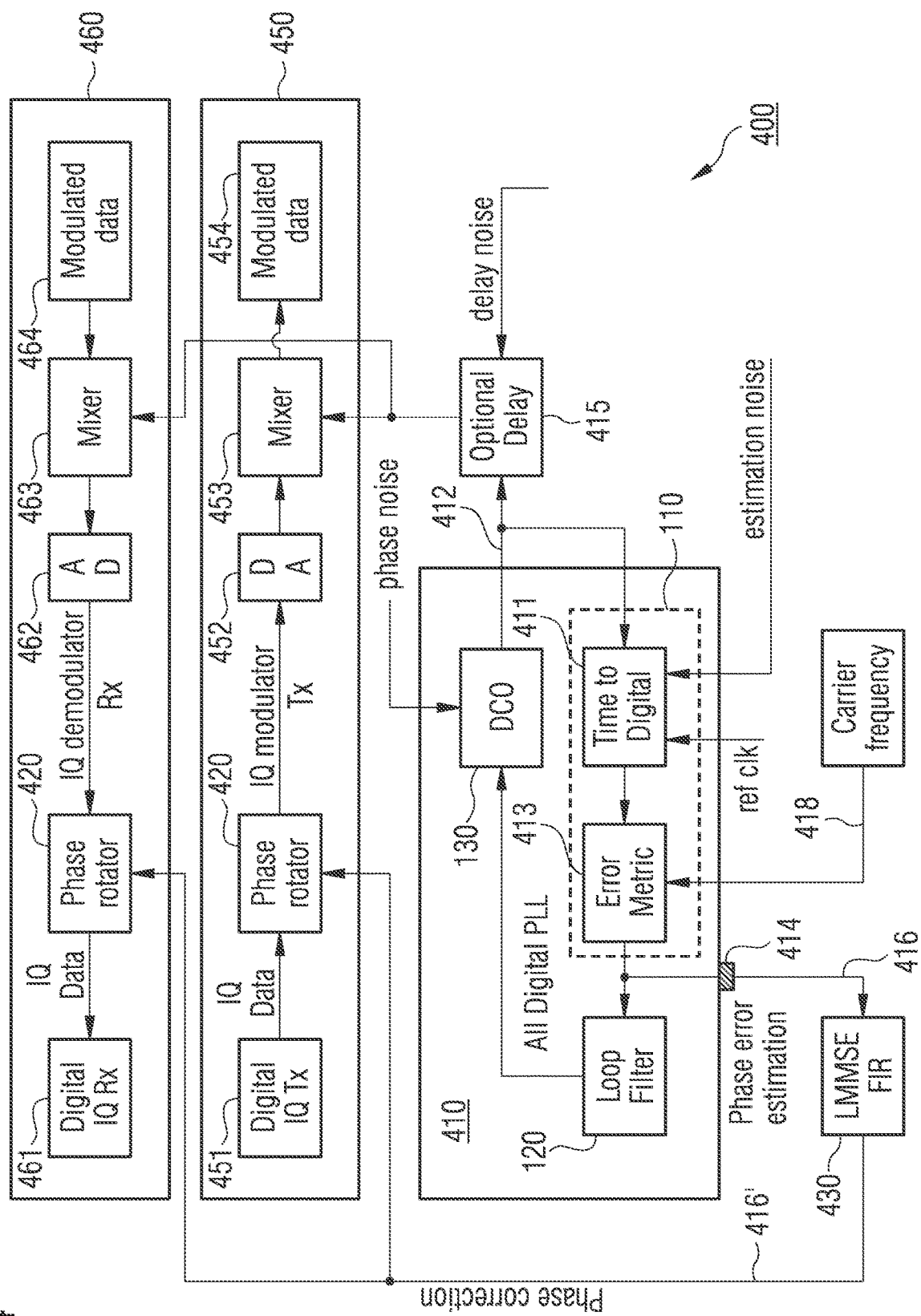
FIG. 4 illustrates transceiver circuitry according to an example of the present disclosure.

FIG. 4 illustrates transceiver circuitry 400 comprising both a receiver portion (Rx) 460 and a transmitter portion (Tx) 450. Rx portion 460 as well as Tx portion 450 use quadrature modulated signals with In-Phase (I) and Quadrature (Q) components in the illustrated example. Phase correction or compensation according to the present disclosure can be applied to both Rx and Tx portions of transceiver circuitry 400.

Transceiver circuitry 400 comprises an ADPLL 410 having a similar structure compared to the DPLL 100 explained with reference to FIG. 1. Here, phase detector 110 comprises a Time-to-Digital Converter (TDC) 411 to generate a digital representation of output or carrier signal 412 generated by the ADPLL 410. Here, the carrier signal 412 can be of square waveform and have a carrier frequency of 2.4 GHz or in the range from 5 to 6 GHz, for example. However, any carrier frequencies are possible. Note that TDC 411 will usually introduce additional quantization noise and jitter to its digital output signal, e.g., a digital word specifying a delay from a carrier signal edge to a nearest edge of a reference clock (delay or phase error) provided to TDC 411. In some implementations, this TDC reference clock may have a frequency of 76.8 MHz. The digital output of TDC 411 is then fed, together with a digital representation of nominal carrier signal 418, to an error metric computation block 413. Based on a comparison of nominal carrier signal (reference signal) 418 and the output signal of TDC 411, error metric computation block 413 computes or generates raw phase error metric samples 416 being indicative of an instantaneous phase difference between the output signal of TDC 411 and nominal carrier signal 418. In other words, the raw phase error metric samples 416 reflect the TDC output signal's deviation from nominal frequency target. The skilled person having benefit from the present disclosure will appreciate that raw phase error metric samples 416 are still subject to the quantization and jitter effects introduced by TDC 411. Within ADPLL 410 these effects may be reduced using digital loop filter 120 to optimize tracking error, noise rejection and loop stability. The output of loop filter 120 is controls DCO 130 which is introduces DCO noise contributing to the phase error.

ADPLL 410 comprises an output 414 for the raw phase error metric samples 416, which are filtered by a specially designed digital smoothening filter 430. Its filter coefficients may be pre-computed, for example based on known Power Spectral Density (PSD) properties. In some implementations, adaptive computation or refinement using pilots or decoded data may be feasible. In the illustrated example, digital filter 430 is implemented as a digital non-causal LMMSE FIR filter. The computation of filter coefficients w based on an autocorrelation matrix $R_{yy}$ of the filter input signal and a cross-correlation vector $r_{yx}$ of the input and desired signals can be obtained according to $w=R_{yy}^{-1}r_{yx}$, for example.

Smoothened phase error metric samples 416' at the output of filter 430 may be used to (de-) rotate IQ data samples of Tx path 450 and/or to (de-) rotate IQ data samples of Rx path 460 of transceiver circuitry 400. Tx path 450 comprises a digital baseband processor 451 providing IQ data samples according to a quadrature modulation scheme, such as Quadrature Amplitude Modulation (QAM), for example. Each pair of IQ data samples represents a complex valued data symbol having an amplitude and a phase. The IQ data samples are fed to phase rotator 420 to (de-) rotate their respective phase values using smoothened phase error metric samples 416'. In other words, assuming that a smoothened phase error estimate is φ, phase rotator 420 may rotate the phase of one or more IQ data samples by −φ, for example. This process leads to compensated IQ data samples at the output of phase rotator 420. Each pair of compensated IQ data samples thus represents a complex valued data symbol having an amplitude and a compensated or (de-) rotated phase. In the illustrated example, the digital baseband signal comprising the compensated IQ data samples is digital-to-analog converted using a Digital-to-Analog Converter (DAC) 452. The resulting compensated analog baseband signal is then up-converted to RF domain by mixing it with carrier signal 412 generated by the ADPLL 410. For this purpose Tx path 450 may comprise a mixer 453 configured to mix the baseband signal with the carrier signal 412 to generate an RF transmit signal 454. Due to the phase compensation in the baseband domain, the resulting RF transmit signal 454 will ideally have no or at least reduced carrier phase errors with respect to reference signal 418.

The skilled person having benefit from the present disclosure will appreciate that the phase compensation does not necessarily have to be performed in the baseband domain, but can also be done in an Intermediate Frequency (IF) or RF domain, e.g., after mixing the baseband signal with carrier signal 412.

As can be seen from the Tx portion 450 of FIG. 4, the present disclosure also provides transmitter circuitry comprising a DPLL 410 configured to generate a carrier signal 412 and to determine a phase error 416, 416' between a reference signal 418 and the carrier signal 412. A phase rotator 420 is coupled between the DPLL 410 and a transmit data path 450 and configured to rotate a phase of a transmit signal based on the phase error 416, 416'.

As can be seen from FIG. 4, phase error compensation can additionally or alternatively be performed in the Rx branch 460 of transceiver device 400. Here, an RF receive signal 464 comprising modulated data is down-converted to baseband domain by mixing it with carrier signal 412 afflicted with phase error with respect to reference signal 418. For this purpose Rx path 460 may comprise a mixer 463 configured to mix the received RF signal 464 with the carrier signal 412 to generate an analog baseband signal. The resulting analog baseband signal is then analog-to-digital converted using an Analog-to-Digital Converter (ADC) 462. IQ data samples of the resulting digital baseband signal are then fed to phase rotator 420 to (de-) rotate their respective phase values using the smoothened phase error metric samples 416'. This leads to compensated IQ data samples at the output of phase rotator 420. Thus, phase errors due to mixing with carrier signal 412 may be at least reduced. The compensated IQ data samples may then be further processed by a digital Rx baseband processor 461.

As can be seen from the Rx portion 460 of FIG. 4, the present disclosure also provides receiver circuitry comprising a DPLL 410 configured to generate a carrier signal 412 and to determine a phase error 416, 416' between a reference signal 418 and the carrier signal 412. A phase rotator 420 of the receiver circuitry is coupled between the DPLL 410 and a receive data path 460 and configured to rotate a phase of a receive signal based on the phase error 416, 416'.

In particular for the Rx portion 460, the filter 430 can be an adaptive digital filter based on pilot signals and/or on decision feedback. The adaptive filter can adapt to varying signal statistics of the receive signal and/or the phase error signal 416, for example. Additionally or alternatively, the filter 430 can be an adaptive Least Mean Squares (LMS) filter used to mimic a desired filter by finding the filter coefficients that relate to producing the least mean squares of a difference between a desired and the actual signal phase error signal 416.

Figure 5:
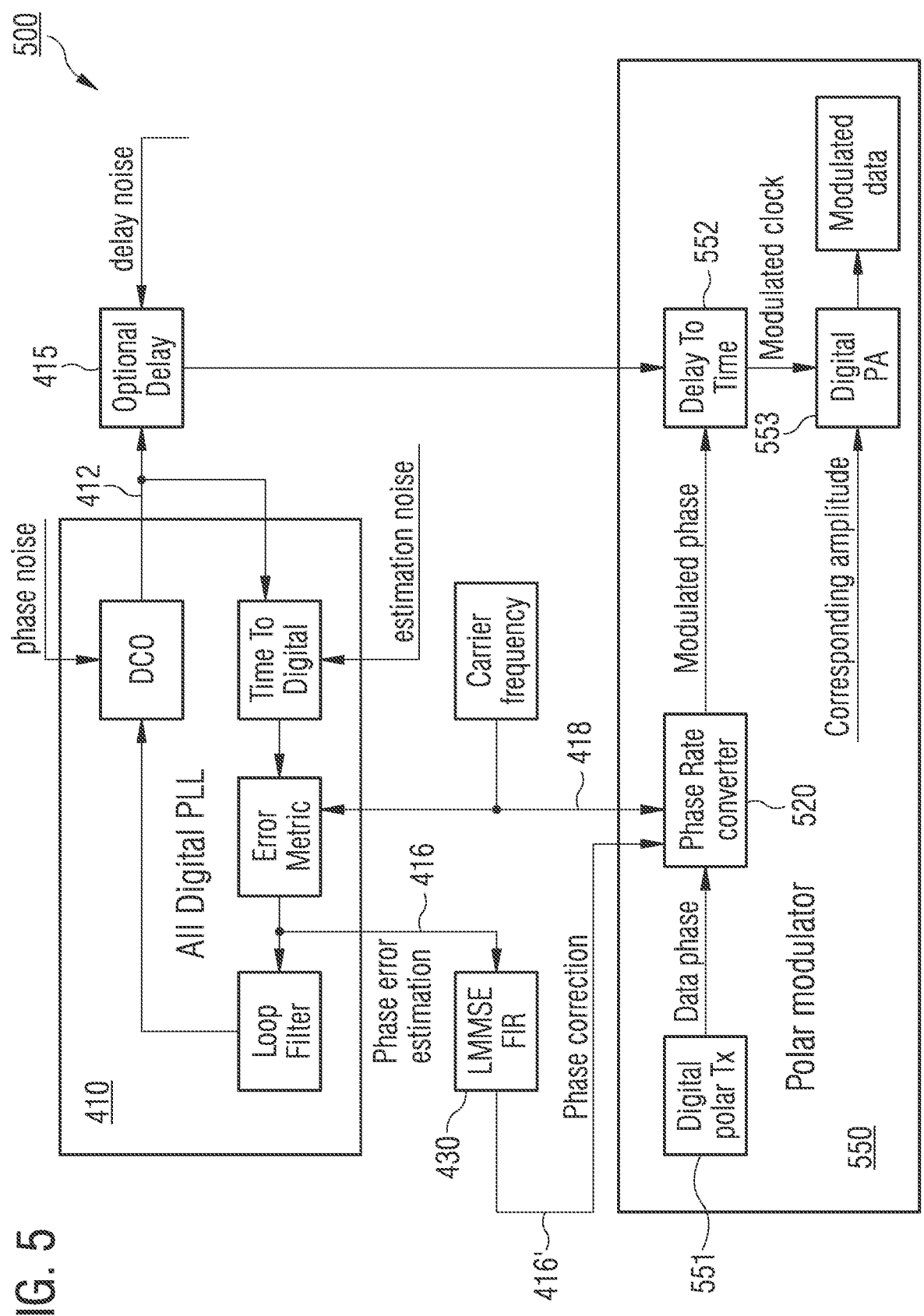
FIG. 5 illustrates transmitter circuitry according to an example of the present disclosure.

Another example of a transmitter 500 using the phase error compensation concept of the present disclosure is shown in FIG. 5.

Transmitter 500 uses the same or a similar ADPLL 410 together with the same or a similar digital phase error smoothening filter 430. Instead of the IQ modulation scheme described with reference to FIG. 4, transmitter 500 employs a Tx path 550 using polar modulation. Polar modulation can be seen analogous to quadrature modulation in the same way that polar coordinates are analogous to Cartesian coordinates. Quadrature modulation makes use of Cartesian coordinates, x and y. When considering quadrature modulation, the x axis is called the I (in-phase) axis, and the y axis is called the Q (quadrature) axis. Polar modulation makes use of polar coordinates, r (amplitude) and Θ (phase). The quadrature modulator approach of FIG. 4 requires a linear RF power amplifier which can create a design conflict between improving power efficiency or maintaining amplifier linearity. Compromising linearity can cause degraded signal quality, usually by adjacent channel degradation, which can be a fundamental factor in limiting network performance and capacity. On the other hand compromising power efficiency increases power consumption (which reduces battery life in handheld devices) and generates more heat. The issue of linearity in a power amplifier can be mitigated by requiring that the input signal of the power amplifier be "constant envelope", i.e. contain no amplitude variations. In a polar modulation system, the power amplifier input signal may vary only in phase. Amplitude modulation can then be accomplished by directly controlling the gain of the power amplifier through changing or modulating its supply voltage. Thus, a polar modulation system allows the use of highly non-linear power amplifier architectures such as Class E and Class F.

Tx path 550 comprises a digital baseband processor 551 providing digital phase data samples according to a polar modulation scheme. The phase data samples are fed to phase rotator 520 to (de-) rotate their respective phase values using smoothened phase error metric samples 416' and the nominal carrier phase 418. Assuming that a smoothened phase error estimate is φ, phase rotator 520 may change a corresponding nominal carrier phase by −φ, for example. In the example of FIG. 5, phase rotator 520 may optionally also perform a phase rate conversion from DPLL reference clock to modem clock of Tx path 550. Phase rotator 520 generates compensated phase data samples at its output. The phase of the carrier signal 412 may be modulated in accordance with the compensated or modulated phase data samples. This may be done by combining the carrier signal 412 with the compensated phase data samples by means of a Delay-to-Time Converter (DTC) 552. DTC 552 generates a modulated carrier signal based on the carrier signal 412 and the compensated or modulated phase data samples coming from phase rotator 520. Thereby the modulation of the carrier signal is compensating for the phase error of carrier signal 412, such that the phase of the modulated carrier signal ideally corresponds to the (desired) nominal carrier phase 418. Amplitude modulation can then be accomplished by directly controlling the gain of a digital power amplifier 553 resulting in a RF signal comprising modulated data 554.

Figure 6:
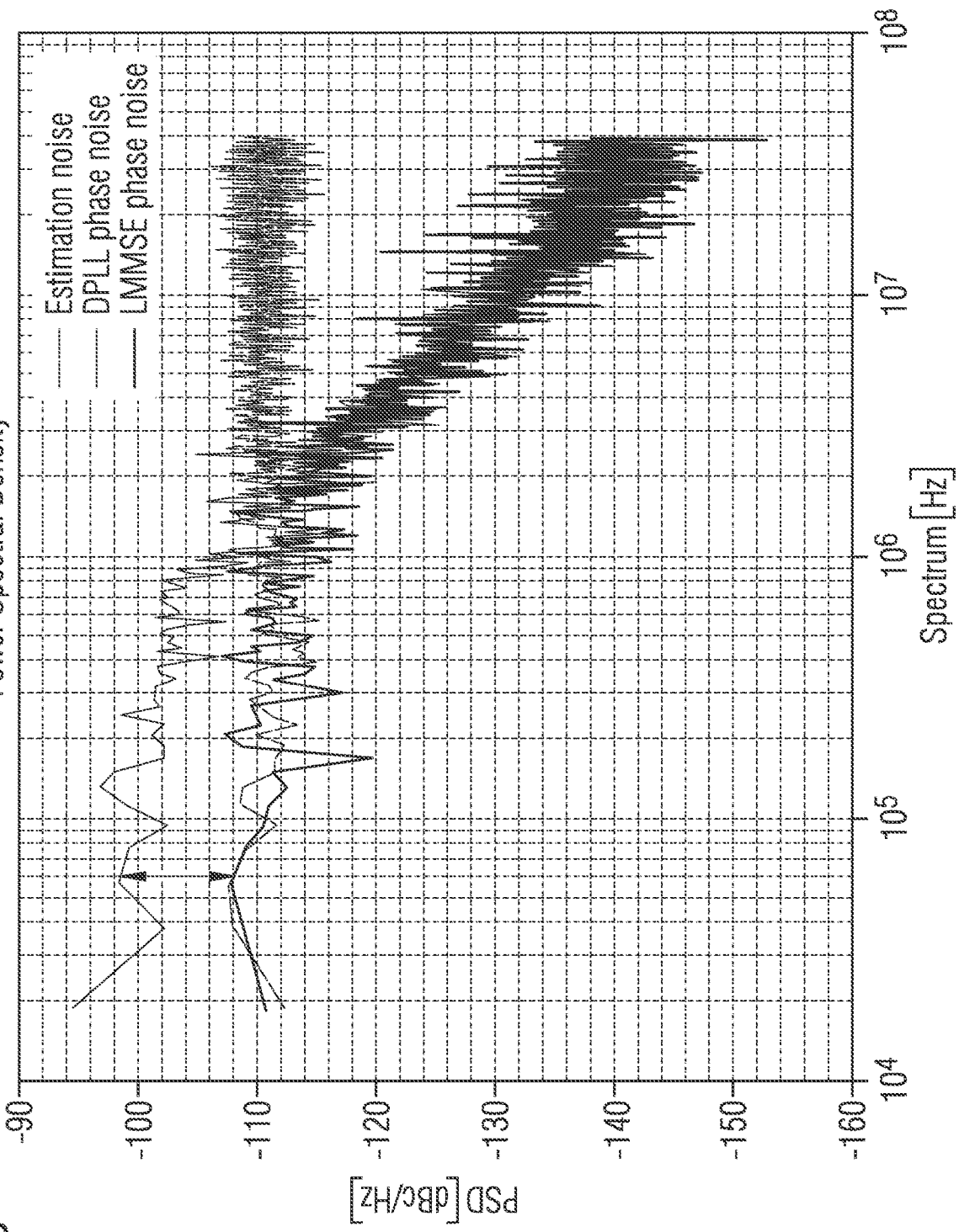
FIG. 6 shows a potential gain of phase noise control over a practical implementation of a DPLL.

FIG. 6 is showing the potential gain of a PNC according to an example over a practical implementation of DPLL. As can be seen, Integrated Phase Noise (IPN) margins are up to 8 dB.

Figure 7:
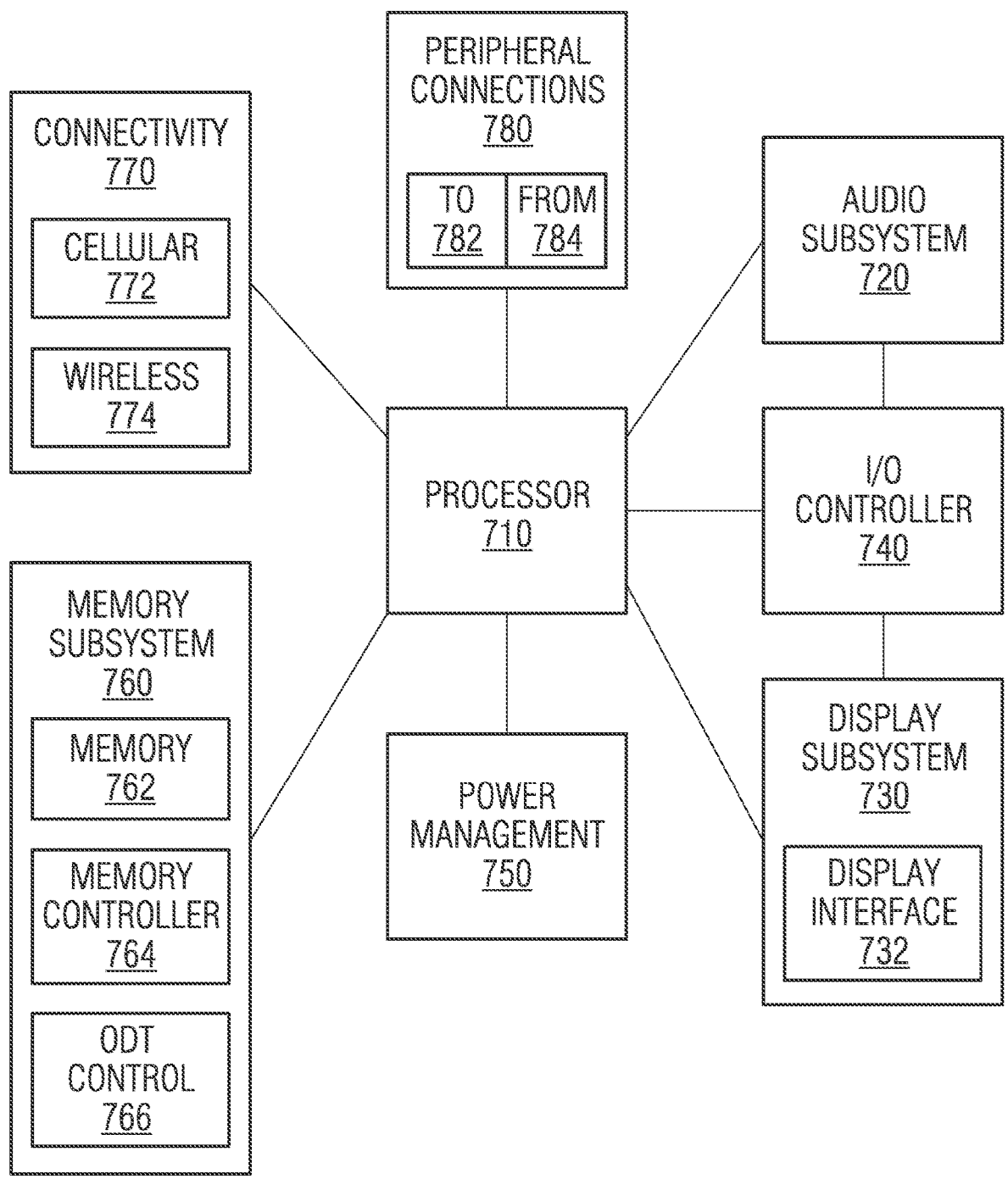
FIG. 7 shows a block diagram of an example device including carrier phase error compensation.

FIG. 7 is a block diagram of an example of a device, e.g. a mobile device, in which compensation/cancelation of carrier phase errors according to example implementations can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication, such as NFC. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

To summarize, the present disclosure proposes a digital phase noise cancelation scheme based on error metric samples available from a DPLL. The error metric samples can be smoothed to minimize the impact of digital estimation noise. Applications can be phase noise cancelation in digital transmitters and receivers. The scheme can support optimal non-causal smoothing in the sense of LMMSE. Adaptive data/pilot aided adaptation of the smoother is possible at the receiver. The PNC may provide the benefits of a non-causal filter. No training is required since the noise can be estimated directly from the DCO/VCO phase. The phase noise can be estimated and recovered at any time regardless of framing.

In applications directed to polar modulators, the carrier phase can be combined with the data phase to create a modulated clock signal for the digital power amplifier (DPA). Carrier phase fluctuations can be compensated by the data phase. The DPLL error metrics can be smoothed by the LMMSE filter and applied to the data chain. An optimal non-causal filter can be supported by delaying the carrier phase. In applications directed to IQ modulators, the data can be mixed up by the carrier phase. The smoothed phase error estimation can be used to de-rotate the baseband signal. In applications directed to IQ demodulators, the data can be mixed down by the carrier phase. The smoothed phase error estimation can be used to de-rotate the baseband signal. Optimal non-causal filter can be supported by additional data path delay.

The following examples pertain to further embodiments.

Example 1 is an apparatus for compensating carrier or clock signal phase fluctuations comprising a digital phase locked loop comprising a phase error output for a phase error between a reference signal and an output signal (e.g., carrier signal or clock signal) generated by the digital phase locked loop. The apparatus further comprises a phase rotator coupled to the phase error output and configured to rotate a phase of a data signal based on the phase error.

In Example 2, the apparatus of Example 1 can further optionally comprise a combiner configured to combine the data signal with the output signal prior to or after rotating the phase of the data signal.

In Example 3, the data signal of any of Examples 1 or 2 can be a transmit signal.

In Example 4, the data signal of any of Examples 1 or 2 can be a receive signal.

In Example 5, the data signal of any of the previous Examples can be a digital baseband signal.

In Example 6, the digital baseband signal of Example 5 can optionally be a quadrature modulated signal or a polar modulated signal.

In Example 7, the apparatus of Examples 5 or 6 can optionally further comprise a combiner configured to combine a received RF signal with the output signal to generate the digital baseband signal.

In Example 8, the apparatus of Examples 5 or 6 can optionally further comprise a combiner configured to combine the digital baseband signal with the output signal to generate an RF transmit signal.

In Example 9, the apparatus of any of the previous Examples can optionally further comprise filter circuitry coupled between the phase error output and the phase rotator and configured to separate the phase error from noise.

In Example 10, the filter circuitry of Example 9 can optionally comprise a digital filter comprising filter coefficients based on phase error samples and/or phase error statistics.

In Example 11, the filter circuitry of Example 9 or 10 can optionally comprise an adaptive digital filter comprising adaptive filter coefficients based on decision feedback.

In Example 12, the filter circuitry of any of Examples 9 to 11 can optionally comprise comprises a non-causal filter.

In Example 13, the filter circuitry of any of Examples 9 to 12 can optionally comprise a low-pass filter.

In Example 14, the filter circuitry of any of Examples 9 to 13 can optionally comprise a linear filter.

In Example 15, the filter circuitry of any of Examples 9 to 14 can optionally comprise a linear MMSE filter.

Example 16 is transmitter circuitry comprising a digital phase locked loop configured to generate a carrier signal and to determine a phase error between a reference signal and the carrier signal. The transmitter circuitry further comprises a phase rotator coupled between the digital phase locked loop and a transmit data path and configured to rotate a phase of a transmit signal based on the phase error.

In Example 17, the transmitter circuitry of Example 16 can optionally further comprise a signal combiner configured to combine the transmit signal with the carrier signal to generate an RF transmit signal.

In Example 18, the transmitter circuitry of Example 16 or 17 can optionally further comprise a digital non-causal linear filter coupled between the digital phase locked loop and the transmit data path and configured to generate smoothened phase error samples.

Example 19 is receiver circuitry comprising a digital phase locked loop configured to generate a carrier signal and to determine a phase error between a reference signal and the carrier signal. The receiver circuitry further comprises a phase rotator coupled between the digital phase locked loop and a receive data path and configured to rotate a phase of a receive signal based on the phase error.

In Example 20, the receiver circuitry of Example 19 can optionally further comprise a signal combiner configured to combine a received RF signal with the carrier signal to generate the receive signal.

In Example 21, the receiver circuitry of Example 19 or 20 can optionally further comprise a digital non-causal linear filter coupled between the digital phase locked loop and the receive data path and configured to generate smoothened phase error samples.

In Example 22, the digital non-causal linear filter of Example 21 can be adaptive based on decision feedback of detected data samples.

Example 23 is an apparatus for compensating carrier or clock signal phase fluctuations. The apparatus comprises means for determining a phase error between a reference signal and an output signal (e.g. carrier or clock signal) generated by a digital phase locked loop, and means for rotating a phase of a data signal based on the phase error before or after combining the data signal with the output signal.

In Example 24, the apparatus of Example 23 can optionally further comprise means for filtering phase error samples of the digital phase locked loop with a non-causal digital low pass filter, and means for rotating the phase of the data signal based on the filtered phase error samples.

Example 25 is a method for compensating phase fluctuations. The method includes determining a phase error between a reference signal and an output signal generated by a digital phase locked loop, and rotating a phase of a data signal based on the phase error before or after combining with the output signal.

In Example 26, the method of Example 25 can optionally further comprise filtering phase error samples of the digital phase locked loop with a digital low pass filter, and rotating the phase of the data signal based on the filtered phase error samples.

In Example 27, the filtering of Example 26 can comprise filtering the phase error samples with a non-causal filter.

In Example 28, the rotating the phase of the data signal of any of Examples 25 to 27 can comprise rotating the phase of a quadrature modulated signal and/or of a polar modulated signal.

Example 29 is a computer program product comprising a non-transitory computer readable medium having computer readable program code embodied therein, wherein the computer readable program code, when being loaded on a computer, a processor, or a programmable hardware component, is configured to implement a method compensating phase fluctuations. The computer implemented method comprises determining a phase error between a reference signal and an output signal generated by a digital phase locked loop, and rotating a phase of a data signal based on the phase error.

The description and drawings merely illustrate the principles of the disclosure. It will thus be appreciated that those skilled in the art will be able to devise various alternative arrangements according to the present disclosure. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What claimed is:

1. Apparatus for compensating phase fluctuations, comprising:
a digital phase locked loop comprising a phase error output for a phase error between a reference signal and an output signal generated by the digital phase locked loop;
filter circuitry coupled between the phase error output and a phase rotator and configured to separate the phase error from noise; and
the phase rotator coupled to the phase error output and configured to rotate a phase of a data signal based on the filtered phase error.

2. The apparatus of claim 1, further comprising:
a signal combiner configured to combine the data signal with the output signal prior to or after rotating the phase of the data signal.

3. The apparatus of claim 1, wherein the data signal a transmit signal.

4. The apparatus of claim 1, wherein the data signal a receive signal.

5. The apparatus of claim 1, wherein the data signal is a digital baseband signal.

6. The apparatus of claim 5, wherein the digital baseband signal is a quadrature modulated signal or a polar modulated signal.

7. The apparatus of claim 5, further comprising:
a signal combiner configured to combine a received RF signal with the output signal to generate the digital baseband signal.

8. The apparatus of claim 5, further comprising:
a signal combiner configured to combine the digital baseband signal with the output signal to generate an RF transmit signal.

9. The apparatus of claim 1, wherein the filter circuitry comprises a digital filter comprising filter coefficients based on phase error samples and/or phase error statistics.

10. The apparatus of claim 1, wherein the filter circuitry comprises an adaptive digital filter comprising adaptive filter coefficients based on decision feedback.

11. The apparatus of claim 1, wherein the filter circuitry comprises a non-causal filter.

12. The apparatus of claim 1, wherein the filter circuitry comprises a low-pass filter.

13. The apparatus of claim 1, wherein the filter circuitry comprises a linear filter, in particular a linear MMSE filter.

14. Transmitter circuitry, comprising:
a digital phase locked loop configured to generate a carrier signal and to determine a phase error between a reference signal and the carrier signal;
a digital non-causal linear filter coupled between the digital phase locked loop and a transmit data path and configured to generate smoothened phase error samples of the phase error; and
a phase rotator coupled between the digital phase locked loop and the transmit data path and configured to rotate a phase of a transmit signal based on the smoothened phase error samples.

15. The transmitter circuitry of claim 14, further comprising:
a signal combiner configured to combine the transmit signal with the carrier signal to generate an RF transmit signal.

16. Receiver circuitry, comprising:
a digital phase locked loop configured to generate a carrier signal and to determine a phase error between a reference signal and the carrier signal;
a digital non-causal linear filter coupled between the digital phase locked loop and a receive data path and configured to generate smoothened phase error samples of the phase error; and
a phase rotator coupled between the digital phase locked loop and the receive data path and configured to rotate a phase of a receive signal based on the smoothened phase error samples.

17. The receiver circuitry of claim 16, further comprising:
a signal combiner configured to combine a received RF signal with the carrier signal to generate the receive signal.

18. The receiver circuitry of claim 16, wherein the digital non-causal linear filter is adaptive based on decision feedback of detected data samples.

19. Method for compensating phase fluctuations, comprising:
determining a phase error between a reference signal and an output signal generated by a digital phase locked loop and generating phase error samples;
filtering the phase error samples of the digital phase locked loop with a digital low pass filter; and
rotating a phase of a data signal based on the filtered phase error samples before or after combining the data signal with the output signal.

20. The method of claim 19, wherein filtering comprises filtering the phase error samples with a non-causal filter.

21. The method of claim 19, wherein rotating the phase of the data signal comprises rotating the phase of a quadrature modulated signal and/or a polar modulated signal.

* * * * *